United States Patent [19]
Barta

[11] Patent Number: 4,975,604
[45] Date of Patent: Dec. 4, 1990

[54] AUTOMATIC RETURN-LOSS OPTIMIZATION OF A VARIABLE FET ATTENUATOR

[75] Inventor: Gary S. Barta, Portland, Oreg.

[73] Assignee: TriQuint Semiconductor, Inc., Beaverton, Oreg.

[21] Appl. No.: 430,981

[22] Filed: Nov. 2, 1989

Related U.S. Application Data

[63] Continuation of Ser. No. 55,664, May 29, 1987, abandoned.

[51] Int. Cl.⁵ .............................................. H03K 5/08
[52] U.S. Cl. .................................... 307/568; 330/284; 333/81 R
[58] Field of Search ........................ 330/144, 145, 284; 333/81 R; 307/264, 568

[56] References Cited

U.S. PATENT DOCUMENTS 3,710,270   1/1973   Addis et al. ..................... 330/284 X Primary Examiner—James B. Mullins
Attorney, Agent, or Firm—Alexander C. Johnson; William S. Lovell; John D. Winkelman

[57] ABSTRACT

A variable FET attenuator uses feedback in a control loop to correct the attenuator automatically for input-/output return loss as the attenuator is varied with a control signal input. Both the series and shunt variable FETs are set to the proper conductance to maintain a proper input match with a desired attenuation value. A second, reference attenuator circuit provides feedback control of the primary attenuator circuit through an operational amplifier. The reference circuit is designed to be electrically equivalent to the attenuator circuit in terms of characteristic impedance. The control nodes, and attenuation control signal input and an output from the operational amplifier, are paralleled so that both the reference and primary attenuator circuits behave identically, without having to RF decouple the feedback loop from the attenuator circuit. Preferably, identical bridged-T variable attenuators are used for both the attenuator circuit and the reference circuit. Precise matching is obtained by incorporating both circuits in the same monolithic integrated circuit substrate, together with the operational amplifier.

31 Claims, 5 Drawing Sheets

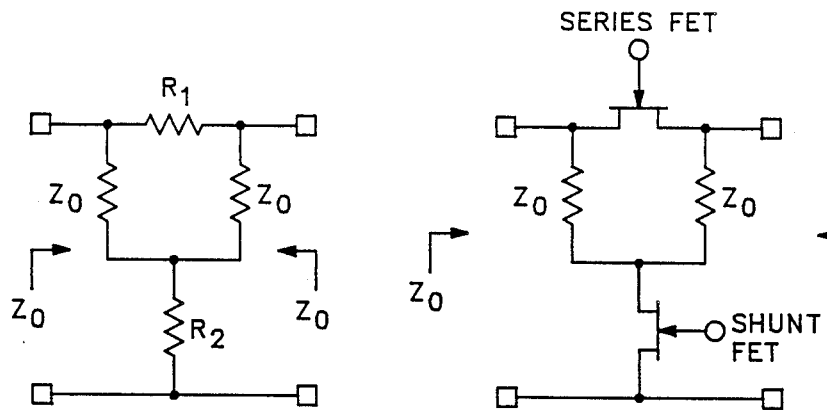
FIG.1A PRIOR ART
FIG.1B PRIOR ART
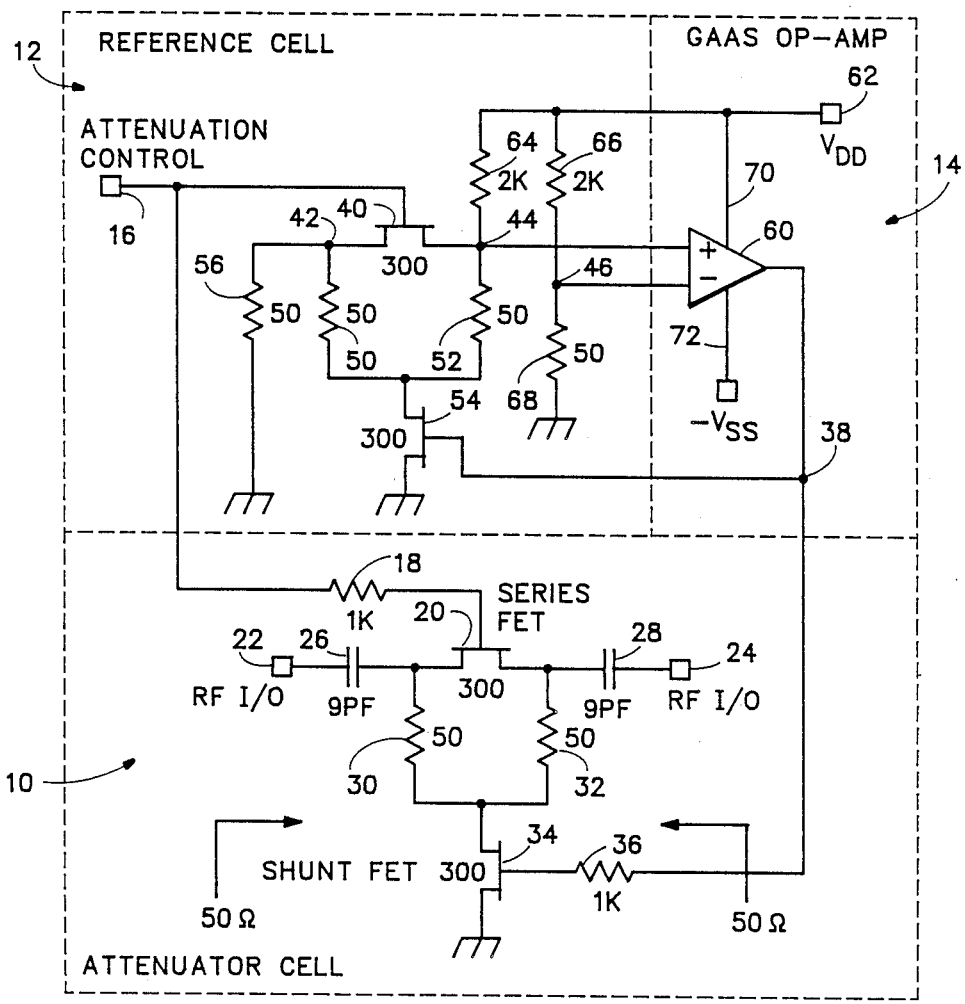
FIG.2

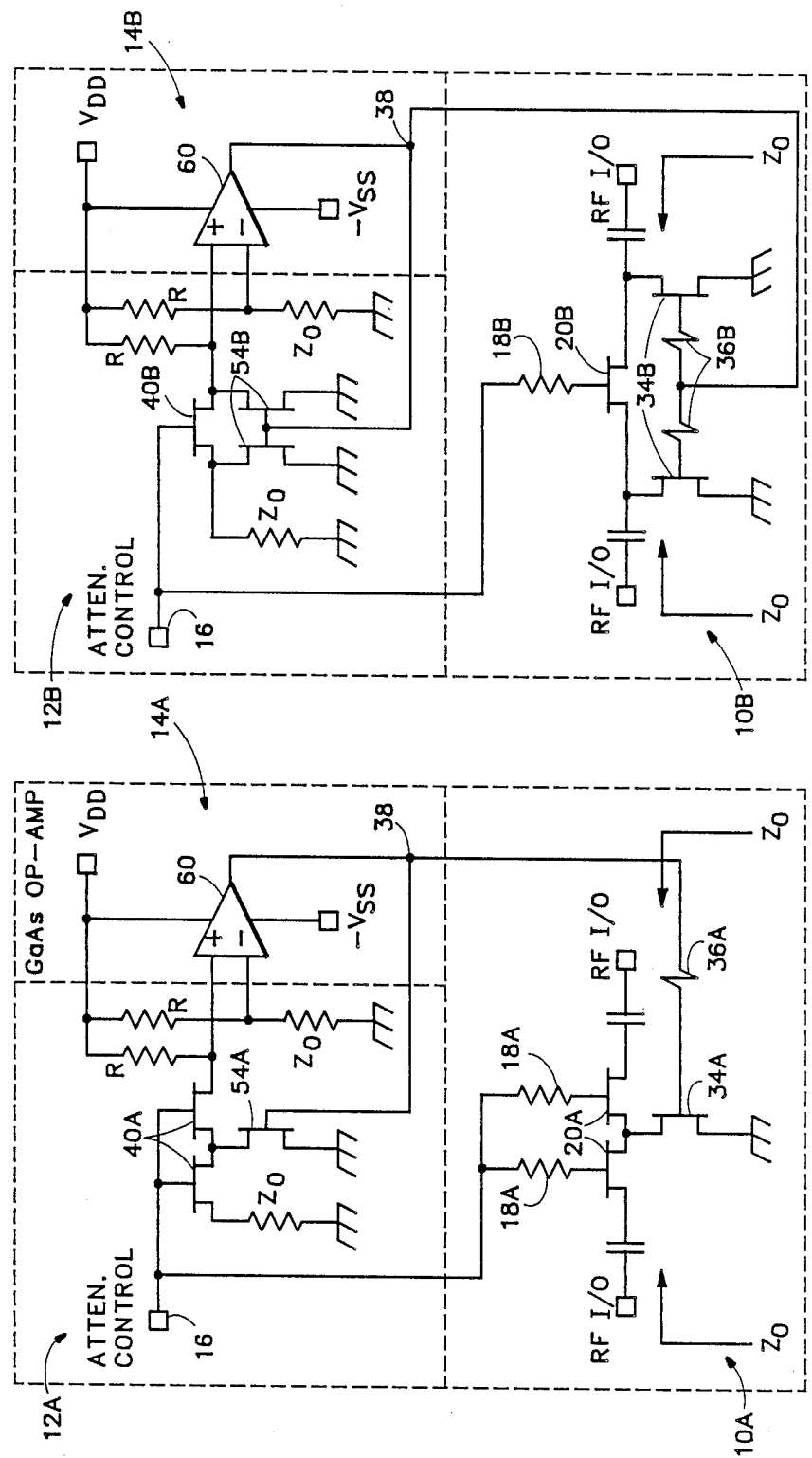

AUTOMATIC RETURN-LOSS OPTIMIZATION OF A VARIABLE FET ATTENUATOR

This is a continuation of application Ser. No. 07/055,664 filed May 29, 1987 and now abandoned.

BACKGROUND OF THE INVENTION

This invention relates generally to microwave systems and components, and more particularly to a circuit and method for optimizing operation of a wide band variable attenuator Gain control of amplifier cascades generally requires a variable attenuator element. For amplifier gain flatness and stability, it is desirable that the attenuator provide low source and load VSWR regardless of the attenuation value. It is especially important to maintain a constant impedance in transmission line circuits. This precludes reflective attenuator topologies.

The classic bridged-T attenuator is described in *Reference Data for Radio Engineers*, 5th ed., ITT/Howard W. Sams & Co., Inc. 1968, and shown in FIG. 1A. This circuit becomes a continuously variable absorptive attenuator when $R_1$, the series bridging resistance, and $R_2$, the shunt resistance, are allowed to vary as follows:

$$R_1 R_2 = Z_0^2 \tag{1}$$

where $Z_0$ is the desired characteristic impedance. The attenuation, when matched, is given by $$\begin{aligned}\text{attenuation (dB)} &= 20 \log((R_1/R_2)^{\frac{1}{2}} + 1) \\ &= 20 \log((R_1/Z_0) + 1).\end{aligned} \tag{2}$$

A continuously variable implementation of the bridged-T attenuator has been realized by replacing the series and shunt resistances $R_1$ and $R_2$ of FIG. 1A with FETs operating in the linear region, as in FIG. 1B.

In practice, however, prior art variable FET attenuators exhibit undesirable variations in impedance over their attenuation range and with changes in operating temperature Another implementation of a variable attenuator circuit is disclosed by R. Chattopadhyay et al. in *Proc. RF Technology Expo* 86, pp. 573–574 (Jan. 1986) This attenuator uses discrete PIN diodes as the variable resistors in a 1 MHz to 500 MHz bandwidth attenuator. The product $R_1 R_2$ is an exponential function:

$$R_1 R_2 = K_1 e^{(kT/V_1 + V_2)}$$

where $K_1$ is defined as a constant T is temperature and k is Boltzmann's constant This circuit is temperature sensitive. In practice, constants such as $K_1$ also tend to vary among discrete components. Additionally, complex active and inductive DC control circuitry is needed to bias and control current through the diodes Finally, this circuit does not appear to be operative over a broad microwave frequency range Gallium-arsenide monolithic microwave integrated circuits (MMICs) have recently ventured from the development stage into the marketplace The majority of MMICs currently available are gain blocks, with only a few exceptions. Examples of MMICs are disclosed in L. Larson et al., "GaAs differential amplifiers " in Proc. 1985 IEEE GaAs IC Symp., pp. 19–22; J. Vorhaus et al., "Monolithic dual-gate GaAs FET digital phase shifter," in Proc. 1981 IEEE GaAs IC Symp., paper 35; D. Pavlidis et al., "A new, specifically monolithic approach to microwave power amplifiers," in Proc. 1983 IEEE Microwave and Millimeter-Wave Monolithic Circuits Symp., pp. 54–58; Y. Ayasli et al., "2–20 GHz GaAs traveling-wave power amplifier," IEEE Trans Microwave Theory Tech., vol. MTT—32, pp. 290-295, Mar 1984, and K. Jones et al., "A 1 to 10 GHz tapered distributed amplifier in a hermetic surface mount package " in Proc. 1985 IEEE GaAs IC Symp., pp. 137–140. The additional microwave "building blocks" are not yet available, mainly because of the application-specific nature of microwave design Because GaAs MMICs need to address a broad spectrum of applications and bandwidths, standard function MMICs must be carefully chosen. Otherwise, the volume of MMICs will not realize the lower price per component that is one of the major goals of moving circuits to the monolithic level.

A need remains for an improved variable attenuator, more particularly for a variable RF attenuator that provides substantially constant impedance and low return-loss characteristics for various attenuations over a broad microwave frequency range.

SUMMARY OF THE INVENTION

One object of the invention is to improve the operation of variable FET attenuators, particularly those operating in the microwave frequency range Another object of the invention is to minimize temperature dependency of variable RF attenuators A further object of the invention is to reduce the susceptibility of RF variable attenuators to variations among components.

An additional object is to implement a variable attenuator in an economical circuit that addresses a broad spectrum of applications In accordance with the invention, a variable FET attenuator uses feedback in a control loop to correct the attenuator automatically for input/output return loss as the attenuator is varied with a control signal input. To maintain a proper input match with a desired attenuation value, both the series and shunt variable FETs must be set to the proper conductance In accordance with the invention, a second, reference attenuator circuit provides feedback control of the primary attenuator circuit through an operational amplifier. The reference circuit is designed to be electrically equivalent to the attenuator circuit in terms of characteristic impedance. The control nodes, and attenuation control signal input and an output from the operational amplifier, are paralleled so that both the reference and primary attenuator circuits behave identically. This arrangement eliminates the need to RF decouple the feedback loop from the attenuator circuit; if present, such decoupling would change the attenuator S-parameters in an undesirable way.

Preferably, a circuit identical to the primary attenuator circuit is used as the reference circuit Precise matching is obtained by incorporating both circuits in the same monolithic integrated circuit substrate, together with the operational amplifier. The invention is preferably implemented using a bridged-T variable attenuator but can, alternatively, be implemented using a symmetrical T or symmetrical pi variable FET attenuator circuit design. The invention thus provides both temperature compensation and autobiasing of the shunt FET gate voltages for both the reference and attenuator circuits.

In an operative example of the preferred embodiment, a wide-band monolithic GaAs bridged-T variable attenuator—in combination with an identical reference circuit, terminated with the characteristic impedance, and an on-chip GAAs operational amplifier, stabilized to about a 100 MHz bandwidth, arranged designed as described above—internally optimizes input and output return loss over a 1–10 GHz bandwidth.

The foregoing and other objects, features and advantages of the invention will become more readily apparent from the following detailed description of a preferred embodiment which proceeds with reference to the drawings.

BRIEF DESCRIPTION OF THE DRAWINGS

FIGS. 1A and 1B are schematic diagrams of prior art fixed and variable bridged-T attenuator circuits, with the series and shunt resistors of FIG. 1A replaced with FETs in FIG. 1B.

FIG. 2 is a schematic diagram of a monolithic 1–10-GHz variable attenuator using GaAS FETs in the bridged-T configuration with on-chip return-loss optimizing circuitry, in accordance with the invention.

FIGS. 6 and 7 are alternative, symmetric T and pi implementations of the attenuator of the invention.

DETAILED DESCRIPTION

Analysis of Variable FET Attenuator

Figure 2A:
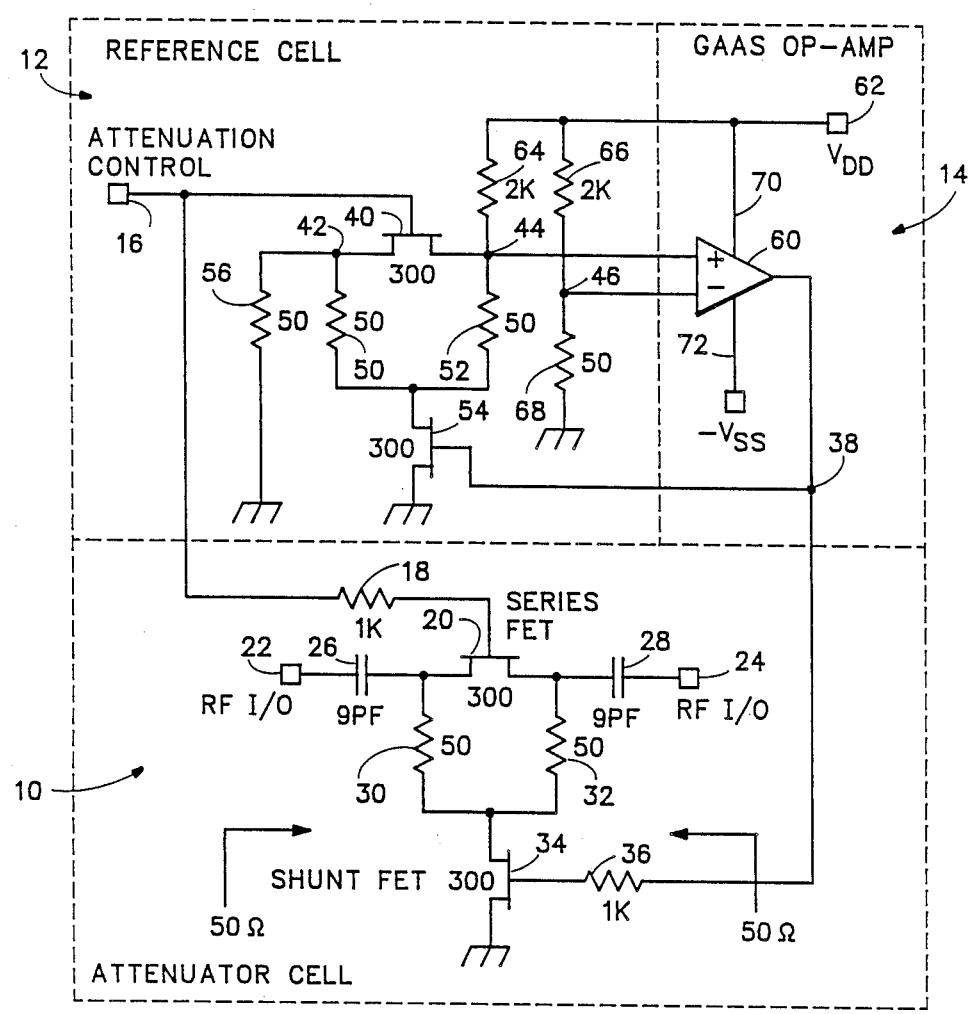
FIG. 2A is a schematic diagram of an alternative embodiment of the circuit of FIG. 2.

The channel resistance of a FET operating in the linear region can be varied by $V_{gs}$, and is essentially $1/g_{msat}$, where $g_{msat}$ is the transconductance from the saturated region. The relationship between drain current $I_{ds}$ and drain voltage $V_{ds}$ is $$I_{ds} \approx 2 \frac{W}{L} \beta_0 (V_{gs} - V_p) V_{ds} \approx g_{msat} V_{ds} \qquad (3)$$

where W and L are the FET gate width and length, respectively, and $V_p$ is the pinchoff voltage. For a GaAs FET, the transconductance parameter $\beta_0$ is given as $\beta_0 \approx (\mu e_s / 2a)$ where $\mu$ is the channel electron mobility, $e_s$ is the permittivity of the GaAs, and a is the channel thickness (S. Sze, *Physics of Semiconductor Devices*, 2nd ed. New York: Wiley, 1981, ch. 6). It can be seen from equation (3) that the channel resistance $(\partial I_{ds}/\partial V_{ds})^{-1}$ is dependent on GaAs process spreads, through both $\beta_0$ and $V_p$.

The task then is to control the product of series and shunt channel resistances for proper attenuator operation.

Solving for the necessary applied GaAs FET voltages in FIG. 1B yields the following relation (between series and shunt gate voltages $V_{gs1}$ and $V_{gs2}$), for maintaining good return loss at any given attenuation for FETs of equal geometry:

$$(V_{gs2} - V_p) = \frac{L^2}{4W^2 \beta_0^2 Z_0^2 (V_{gs1} - V_p)} . \qquad (4)$$

At low frequencies, the attenuation for equal geometry series and shunt FETs when (4) is satisfied is given by $$\begin{aligned}\text{attenuation (dB)} &= 20 \log \left\{ \left( \frac{V_{gs2} - V_p}{V_{gs1} - V_p} \right)^{\frac{1}{2}} + 1 \right\} \\ &= 20 \log \left( \frac{L}{2W \beta_0 Z_0 (V_{gs1} - V_p)} + 1 \right). \end{aligned} \qquad (5)$$

Fortunately, feedback can be used to control input and output return loss as attenuation is changed, invariant of any process effects or differences between FET geometries.

In accordance with a preferred embodiment of the invention, FIG. 2 shows the combination of a bridged-T attenuator cell 10 and a reference attenuator cell 12 and an operational amplifier 14. (Input protection and level shifting circuits on the control input are not shown.). This circuit is arranged to maintain, for example, a 50-ohm impedance for RF input and output signals by adjusting the shunt FET gate voltage in the attenuator cell in response to an arbitrary voltage variation on the series FET gate.

The circuit has an attenuation control signal input 16. This input is coupled to the attenuator cell, through a resistor 18, to the gate of a series FET 20. The series FET has a source and drain symmetrically coupled to RF input/output terminals 22, 24 through series capacitors 26, 28. These capacitors are used for dc blocking so that the circuit can operate from a single power supply with appropriate level shifting (not shown) They can be omitted to extend bandwidth to lower frequencies. A pair of 50-ohm resistors 30, 32 are connected from the source and drain, respectively, of series FET 20 to the drain of a shunt FET 34. The source of the shunt FET is connected to ground or other suitable reference voltage (referred to as "ground" hereinafter). Referring back to FIG. 1B, the attenuator cell 10 as so far described has the same input and output characteristic impedances—50 ohms in the example of FIG. 2. The gate of the shunt FET is connected through a resistor 36 to a control signal line 38. As further discussed below, a control signal is applied through line 38 to the gate of shunt FET 34 to control conductance of FET 34, in response to variations of the attenuation control signal. Resistors 18, 36 provide RF isolation at the gates of FETs 20, 36, and have no other significant effect on operation of the attenuator circuit.

The reference cell 12 includes a second attenuator circuit arranged to function in a manner electrically equivalent to the attenuator circuit of cell 10, preferably with the same characteristic input and output impedances. Ideally, the reference circuit is structured like the primary attenuator circuit and has identical component values. It has a series FET 40, with its gate connected to attenuation control signal input 16, a source identified at node 42 and a drain identified at node 44. A pair of 50-ohm resistors 50, 52 are connected between the source and drain nodes 42, 44, respectively, of series FET 40 and the drain of a shunt FET 54. The source of FET 54 is connected to ground or other suitable reference voltage. The shunt FET 54 has a gate connected to control line 38. The source of series FET 40 is terminated by a 50-ohm resistor 56 connected between node 42 and ground.

The operational amplifier 14 is a differential-to-single ended amplifier. It has its positive voltage input connected to node 44 and its negative voltage input connected to a node 46. A voltage supply input 62 ($V_{DD}$) is connected to each of these nodes through matched resistors 64, 66. Node 46 is also coupled to ground through a 50-ohm resistor 68 to establish a reference voltage at node 46. It also serves to terminate the bridged-T attenuator reference cell 12 through amplifier 60. Amplifier 60 is powered by connection through line 70 to the power supply voltage $V_{DD}$ and line 72 to a negative supply voltage $-V_{ss}$.

Figure 3:
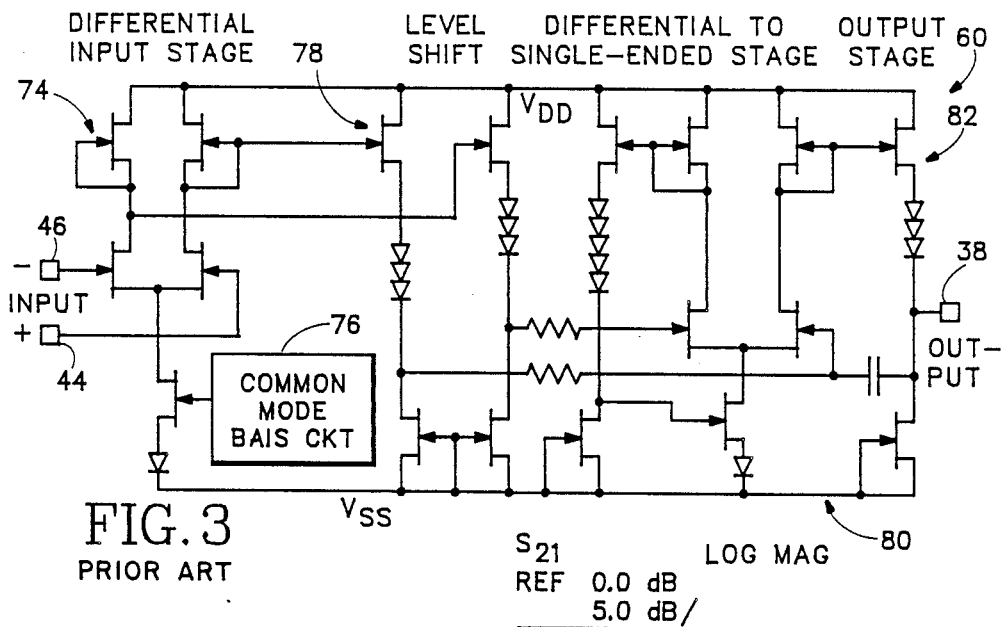
FIG. 3 is a schematic diagram of the GaAs operational amplifier used in the attenuator circuit of FIG. 2.

FIG. 3 shows a schematic diagram of the GaAs operational amplifier 60 used in the attenuator design of FIG. 2. It comprises an input differential-amplifier pair 74 with a common-mode bias circuit 76 (see U.S. Pat. No. 4,616,189 to Pengue), a pair of differential level shift stages 78, and a differential-to-single-ended (DSE) stage 80, and an output stage 82, providing approximately 50 dB of open-loop gain. The DSE stage is commonly used in NMOS designs, and was recently verified in GaAs depletion mode technology (see L. Larson et al., above). Since high-frequency performance was not the goal of this amplifier, stability was ensured by excess dominant pole compensation, limiting the bandwidth to under 100 MHz.

The amplifier outputs a control signal on line 38. That signal varies with the reference output signal at node 44, which varies in turn with the attenuation control signal applied to terminal 16. The control signal on line 38 is fed back to the gate of shunt FET 54 to control the reference circuit's operation, and is applied to the gate of shunt FET 34. The operational amplifier operates to provide a control signal that controls the conductance of FET 54 in reference cell 12 in such a manner as to equalize the voltages at nodes 44, 46. In effect, this operation makes the impedance at node 44 the same as that at node 46. Since the same control signal is applied to FET 34, it likewise makes the attenuator cell behave in a manner electrically equivalent to the reference cell. It controls the conductance of FET 34 in such a manner as to cause the voltages from the source and drain of FET 20 across FET 34 to ground to be equal to the voltages at nodes 44, 46. In the circuit of FIG. 2, it equalizes the characteristic impedances of the two cells, regardless of variations in attenuation.

Initially, the concept of using reference cell dc parameter feedback to control the RF attenuator cell 10 was verified by using two GaAs FET bridged-T attenuators and a 741 operational amplifier. This concept was then carried to the monolithic level by implementing the attenuator and reference cells 10, 12 and the op-amp 14 on a single GaAs chip. The GaAs integrated circuit was fabricated with a high-yield, 1-μm ion implantation process (see A. Rode et al., "A high-yield GaAs MSI digital IC process," in Proc. IEEE ISDM, 1982, pp. 162-165, and U.S. Pat. No. 4,656,076 to Vetanen et al.), incorporating NiCr resistors for stable terminations and MIM capacitors for on-chip bypassing and decoupling. The circuit was then mounted in a hermetic, surface mount microwave package (see U.S. Pat. No. 4,668,920). Using dc parameters requires that enough voltage be applied to the reference 5 attenuator cell to obtain a usable signal level for the op-amp to measure, but not enough that the FETs leave the linear region. In this design, FET drain-source voltages were kept below 200 mV, operating from a single 9-15 V power supply, by using suitable level shifting circuits.

Several factors have to be considered when using FETs for the shunt and series elements. FET gate widths must be chosen wide enough for low insertion loss in the minimum attenuation state, but small enough to limit parallel drain-to-source capacitance $C_{ds}$ so that the isolation at higher frequencies is sufficient in the maximum attenuation state. Both series and shunt gate widths were chosen as 300 μm. The maximum attenuation is most dependent on the $C_{ds}$ of the series FET, so this device was built as a minimum number of gate fingers to reduce additional drain-to-source capacitance caused by the interconnection parasitics which occur in interdigitated structures. The losses associated with the metal resistance of the wide gate fingers do not affect the RF performance of the attenuator.

Figure 4:
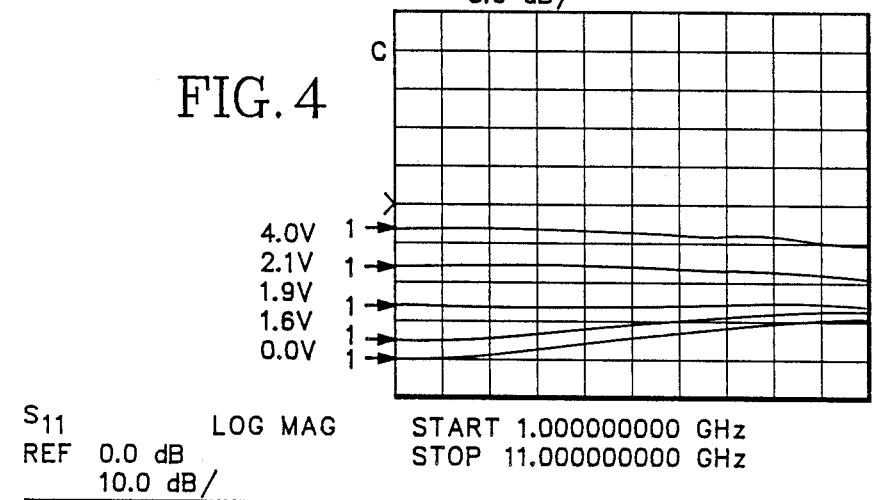
FIG. 4 is a semi-logarithmic graph of attenuation vs. frequency for varying control voltages for the attenuator circuit of FIG. 2.

FIG. 4 shows the transmission characteristics of the packaged attenuator. Five attenuation curves are shown, corresponding to five attenuation signal levels. The voltages shown were level shifted for operation of the attenuator from a single power supply voltage. The gain slope at minimum attenuation is caused by combined skin effect losses due to the package and to the microstrip structures on the GaAs from the edges of the die to the RF attenuator cell. Minimum attenuation is 3.5 dB at 1 GHz, increasing to 5 dB at 10 GHz. In this design, the gate-source voltage $V_{gs}$ of both FETs was never allowed to be positive. If $V_{gs}$ is allowed to go positive near the forward conduction point, the minimum attenuation will improve by approximately 1 dB. The effect of $C_{ds}$ of the series FET upon the maximum attenuation increases visibly at higher frequencies. The attenuation range is 17 dB at 1 GHz, decreasing to 10 dB at 10 GHz.

Figure 5:
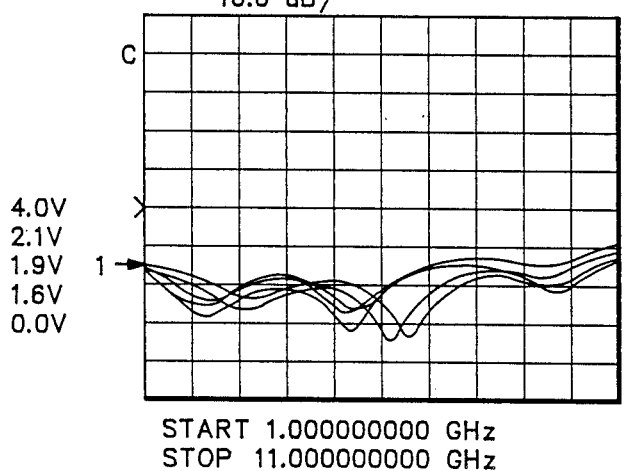
FIG. 5 is a semilogarithmic graph of input return loss vs. frequency for various attenuations using the on-chip match optimization scheme in the attenuator circuit of FIG. 2.

FIG. 5 shows the return loss of the packaged part as a function of frequency using the on-chip correction circuitry. Return loss exceeds 12 dB over the 1-10 GHz ban. This performance demonstrates that the circuit of FIG. 2 internally optimizes the input and output return loss as the attenuation is varied. Packaged input and output voltage standing wave ratio (VSWR) is held to better than 1.7:1 over the entire 1-10 GHz band.

As described above, the preferred embodiment of the invention is implemented using a bridged-T attenuator circuit and reference circuit.

Alternatively, the invention can be implemented using a symmetrical T circuit as shown in FIG. 6. The general circuit arrangement is similar to that of FIG. 2, including an attenuator cell 10A, a reference cell 12A and an operational amplifier 14A. The series FET is provided by a pair of series FETs 20A connected source to drain in series between the RF I/O's 22A, 24A, each FET having its gate connected to the attenuation control input through an RF isolation resistor 18A. Shunt FET 34A has its drain coupled to the source-drain node between the two series FETs 20A. Similarly, a pair of series FETs 40A are used in the reference cell, with the drain of shunt FET 54A connected to the source-drain node between them. The operational amplifier output 38 is connected to the gate FET 34A through resistor 36A and connected to the gate of FET 54A.

In another alternate embodiment, a variable FET attenuator in accordance with the invention can be implemented in a symmetrical "pi" form of attenuator circuit. In this circuit, the attenuator and reference cells each have a single series FET 20B, 40B and a pair of shunt FETs 34B, 54B, arranged in a symmetrical pi circuit. The operational amplifier output 38 is connected to the gates of shunt FETs 34B through resistors 36B and connected to the gates of FETs 54B.

Each of these alternate embodiments will maintain a characteristic impedance from the RF input/outputs to ground (or reference voltage node) in the attenuator cell that is determined by the impedance $Z_o$ from node 46 to ground in the attenuator cell.

Component values shown in FIG. 2 pertain to the specific, operative example for which test results are shown in FIGS. 4 and 5, and obviously can be varied to suit the designer's needs. As mentioned above, electrical equivalency between the attenuator and reference cells is preferably provided by having the same characteristic impedance, resulting in identical circuits in each cell. Such equivalency can alternatively be obtained by appropriately scaling the ratios of the characteristic impedances and FET widths between the two cells. For example, in FIG. 2, the 50-ohm resistors could be 100-ohm resistors and the FETS scaled to a width of 150 μm. in the reference cell.

Figures 6A, 7A:
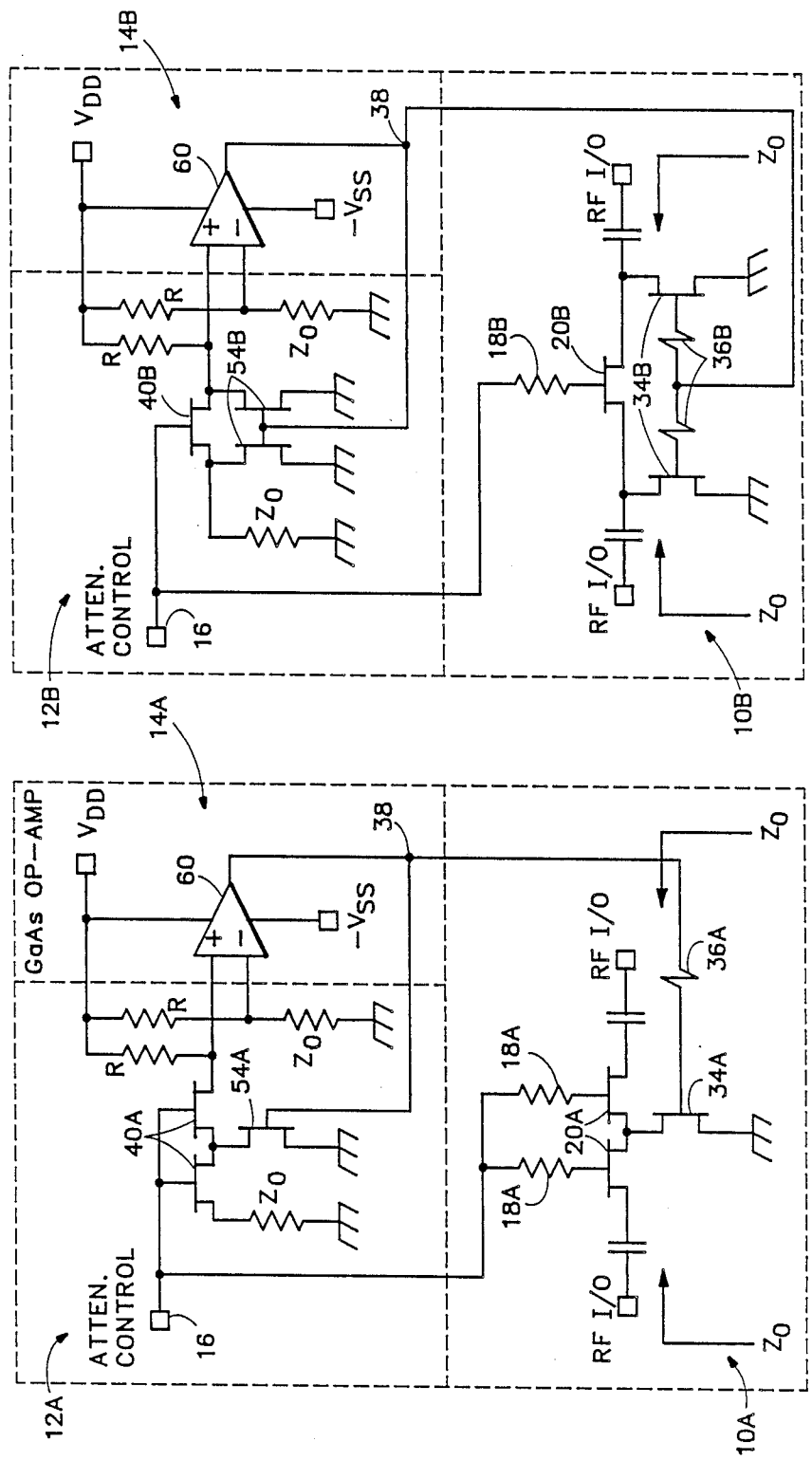
FIGS. 6A and 7A are schematic diagrams of alternative embodiments of the circuits shown respectively in FIGS. 6 and 7.

The concept of using reference cell dc parameter feedback to control the attenuator cell is also not limited to application of the op-amp output control signal to the gates of the shunt FETs. The same principles can be used if the attenuator control signal is applied to the gates of the shunt FETs and the opamp output control signal is applied to the gates of the series FETs. Circuit diagrams which illustrate that alternative connection are shown in FIGS. 2A, 6A and 7A, corresponding to FIGS. 2, 6 and 7, respectively. The elements of FIGS. 2A, 6A and 7A are numbered in the same manner as those of FIGS. 2, 6, and 7, and the operation of such circuits are as previously described except for that manner of connection.

Having illustrated and described the principles of my invention in a preferred embodiment and alternatives thereof, it should be readily apparent to those skilled in the art that the invention can be modified in arrangement and detail without departing from such principles. I claim all modifications coming within the spirit and scope of the accompanying claims

I claim:

1. A variable FET attenuator with automatic return-loss optimization, comprising:
    attenuator circuit means for variably attenuating an input signal and providing an output signal, the attenuator circuit means including:
        a first series FET having a source and drain defining a signal input and output and a gate coupled to an attenuation control signal input;
        a first shunt FET having a gate, a drain, and a source coupled to a reference voltage node; and
        first means for producing a characteristic impedance from the signal input and output to the reference voltage node;
        each of the first FETs having a conductance that is variable in accordance with a bias applied to their respective gates;
    reference circuit means, including a second shunt FET and a second series FET, each having a gate, source and drain, and second means for producing said characteristic impedance, coupled in a manner electrically equivalent to the attenuator circuit means, for generating a reference signal that varies with an attenuation control signal applied to the attenuation control input; and
    operational amplifier means having said reference signal as a first input for generating a control signal for biasing the gates of the first and second shunt FETs.

2. A variable FET attenuator according to claim 1, including means for generating a fixed reference voltage, the operational amplifier means having said fixed reference voltage as a second input and being operable to set the control signal to a level which biases the second shunt FET to a conductance such that a voltage level of the first input is equalized to the fixed reference voltage.

3. A variable FET attenuator according to claim 1, in which the operational amplifier means has an output coupled to the gate of each of the first and second shunt FETs for biasing the gates of both shunt FETs with said control signal.

4. A variable FET attenuator according to claim 1, including means for generating a fixed reference voltage; the operational amplifier means having said fixed reference voltage as a second input, an output coupled to the gate of each of the first and second shunt FETs for biasing both shunt FETs with said control signal, and being operable to set the control signal to a level which biases the second shunt FET to a conductance such that a voltage level of the first input is equalized to the fixed reference voltage, and thereby similarly biasing the first shunt FET.

5. A variable FET attenuator according to claim 1, in which the operational amplifier means is designed so that said control signal has a bandwidth substantially less than a bandwidth of the attenuator circuit means.

6. A variable FET attenuator according to claim 1, in which the operational amplifier means includes a differential input stage having said reference signal as a said first input and having a second input coupled to a terminating impedance equivalent to said characteristic impedance.

7. A variable FET attenuator according to claim 1, in which the reference circuit means includes a terminating impedance connected in series with the source of the second series FET, the terminating impedance being equivalent to said characteristic impedance.

8. A variable FET attenuator according to claim 1, in which the attenuation control signal input is coupled in parallel to the gate of each of the first and second series FETs and an output for said control signal from the operational amplifier means is coupled in parallel to the gate of each of the first and second shunt FETs.

9. A variable FET attenuator according to claim 1, in which the attenuator circuit means is provided by a bridged-T FET attenuator circuit.

10. A variable FET attenuator according to claim 9, in which the reference circuit means is provided by a bridged-T FET attenuator circuit.

11. A variable FET attenuator according to claim 1, in which the attenuator circuit means is provided by a symmetrical T FET attenuator circuit.

12. A variable FET attenuator according to claim 11, in which the reference circuit means is provided by a symmetrical T FET attenuator circuit.

13. A variable FET attenuator according to claim 1 in which at least the attenuator circuit means and the reference circuit means are implemented in a monolithic integrated circuit.

14. A variable FET attenuator according to claim 13 in which the operational amplifier means is implemented in the integrated circuit.

15. A variable FET attenuator according to claim 14 in which the attenuator circuit means has an input/output signal bandwidth in the range of 1 GHz to 10 GHz.

16. A variable FET attenuator according to claim 13 in which the integrated circuit is fabricated on a gallium arsenide substrate.

17. A variable FET attenuator according to claim 1, in which the attenuator circuit means is provided by a pi FET attenuator circuit.

18. A variable FET attenuator according to claim 17, in which the reference circuit means is provided by a pi FET attenuator circuit.

19. A method for automatic return-loss optimization of a variable FET attenuator for variably attenuating a signal of interest, the attenuator including a first series FET having a gate and a source and drain defining a signal input and output, and a first shunt FET having a gate, a source, and a drain coupled to the first series FET so that each of the signal input and output have a characteristic impedance; the method comprising:
   providing a reference circuit electrically equivalent to the attenuator circuit and having input and output terminals;
   inputting a variable attenuation control signal to the gate of the first series FET in the attenuator circuit to variably control attenuation of the signal of interest and to the input terminal of the reference circuit;
   generating from the reference circuit a reference signal that varies with the attenuation control signal;
   generating a control signal from the reference signal; and
   controlling operation of the reference circuit with said control signal; and
   biasing the gate of the first shunt FET with said control signal.

20. A method according to claim 19 including controlling the reference circuit with said control signal so as to equate the reference signal to a fixed reference voltage.

21. A method according to claim 19, in which generating said control signal includes inputting said reference signal as a first input to an operational amplifier and inputting a second, fixed reference voltage as a second input to said amplifier.

22. A method according to claim 19 in which the reference circuit includes a second series FET and a second shunt FET configured equivalently to the first series and shunt FETs of the attenuator circuit, the step of controlling operation of the reference circuit including biasing the gate of the second shunt FET with said control signal.

23. A method according to claim 19, including variably biasing the gates of the series and shunt FETs to control their relative conductance so that the characteristic impedance remains substantially constant over a predetermined bandwidth for a predetermined range of attenuation.

24. A method according to claim 19, including variably biasing the gates of the series and shunt FETs to control their relative conductance so as to optimize return loss over a predetermined bandwidth for a predetermined range of attenuation.

25. A method according to claim 19, including terminating the reference circuit with an impedance equivalent to said characteristic impedance.

26. A method for automatic return-loss optimization of a variable FET attenuator for variably attenuating a signal of interest, the attenuator including a first series FET having a gate, a source, and a drain defining a signal input and output, and a first shunt FET having a gate, a source, and a drain coupled to the first series FET so that each of the signal input and output have a characteristic impedance; the method comprising:
   providing a reference circuit electrically equivalent to the attenuator and having input and output terminals;
   applying a first, variable attenuation control signal to the gate of the first series FET to control attenuation of the signal of interest, and to the input terminal of the reference circuit;
   generating from the reference circuit a reference signal that varies with the attenuation control signal;
   generating a second control signal from the reference signal;
   controlling operation of the reference circuit with the second control signal so as to equate the reference signal to a fixed reference voltage; and
   biasing the gate of the first shunt FET with said second control signal.

27. A method according to claim 26 in which the reference circuit includes a second series FET and a second shunt FET configured equivalently to the first series and shunt FETs, respectively, and in which the step of controlling operation of the reference circuit includes biasing the gate of the second shunt FET with said second control signal in parallel with the attenuator circuit.

28. A method according to claim 26 in which the reference circuit includes a second series FET and a second shunt FET configured equivalently to the first series and shunt FETs, respectively, and in which the step of controlling operation of the reference circuit includes biasing the gate of the second shunt FET with said second control signal in parallel with the attenuator circuit.

29. A method for automatic return-loss optimization of a variable FET attenuator for variably attenuating a signal of interest, the attenuator including a first series FET having a gate, a source, and a drain defining a signal input and output, and a first shunt FET having a gate, a source, and a drain coupled to the first series FET so that each of the signal input and output have a characteristic impedance; the method comprising:
   providing a reference circuit electrically equivalent to the attenuator and having input and output terminals;
   applying a first, variable attenuation control signal to the gate of the first shunt FET to control attenuation of the signal of interest, and to the input terminal of the reference circuit;

generating from the reference circuit a reference signal that varies with the attenuation control signal;

generating a second control signal from the reference signal;

controlling operation of the reference circuit with the second control signal so as to equate the reference signal to a fixed reference voltage; and biasing the gate of the first series FET with said second control signal.

30. A method according to claim 29 in which the reference circuit includes a second series FET and a second shunt FET configured equivalently to the first series and shunt FETs, respectively, and in which the step of controlling operation of the reference circuit includes biasing the gate of the second series FET with said second control signal in parallel with the attenuator circuit.

31. A method according to claim 29 in which the reference circuit includes a second series FET and a second shunt FET configured equivalently to the first series and shunt FETs, respectively, and in which the step of controlling operation of the reference circuit includes biasing the gate of the second shunt FET with said first control signal in parallel with the attenuator circuit.

* * * * *